United States Patent
Chang (10) Patent No.: US 7,800,426 B2
(45) Date of Patent: Sep. 21, 2010

(54) TWO VOLTAGE INPUT LEVEL SHIFTER WITH SWITCHES FOR CORE POWER OFF APPLICATION

(75) Inventor: Yu-Tzu Chang, Miaoli (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/056,648

(22) Filed: Mar. 27, 2008

(65) Prior Publication Data

US 2009/0243692 A1 Oct. 1, 2009

(51) Int. Cl.
*H03L 5/00* (2006.01)

(52) U.S. Cl. .............................. 327/333; 326/80; 326/81

(58) Field of Classification Search ................. 327/333; 326/80, 81
See application file for complete search history.

(56) References Cited

U.S. PATENT DOCUMENTS 6,198,331 B1 * 3/2001 Mihara et al. ............... 327/333
6,580,411 B1 * 6/2003 Kubota et al. ................ 345/98
7,511,556 B2 * 3/2009 Liu et al. ..................... 327/333

* cited by examiner

*Primary Examiner*—Kenneth B. Wells
(74) *Attorney, Agent, or Firm*—K&L Gates LLP (57) ABSTRACT

A voltage level shifter includes a first switch module having a first transistor and a second transistor, each transistor having a drain, a gate, and a source, wherein the drains of the first and the second transistors are coupled to a first voltage terminal. The voltage level shifter further includes a second switch module coupled between the first switch module and a second voltage terminal, the second switch module including at least six transistors coupled each other, wherein each transistor of the second switch module having a gate for receiving a GATE signal, a GATEb signal, a CORE_INPUT signal, a CORE_INPUTb signal, an IO_INPUT signal, or an IO_INPUTb signal, respectively, wherein the second switch module is designed to produce an output signal at an output node in response to the IO_INPUTb signal and the IO_INPUT signal respectively, irrespective of the CORE_INPUTb signal and the CORE_INPUT signal when the GATE signal is logic low, thereby reducing a leakage current flowing from the first voltage terminal to the second voltage terminal.

20 Claims, 7 Drawing Sheets

TWO VOLTAGE INPUT LEVEL SHIFTER WITH SWITCHES FOR CORE POWER OFF APPLICATION

BACKGROUND OF THE INVENTION

The present invention is related generally to an integrated circuit, and more particularly to a voltage level shifter that may be used in various integrated circuits including a LCD controller to reduce power consumption.

A voltage level shifter is a circuit that allows a digital signal to be level shifted from a low supply voltage to a high supply voltage. As the minimum feature size of integrated circuits further decreases, the supply voltage for the core logic section of the integrated circuit (IC) is reduced further to around 1.0 volt or a lower voltage level. However, the supply voltage for the input/output (IO) section of the integrated circuit must be maintained at a higher level (3.3 volts or much higher voltage) to assure adequate signal-to-noise ratio and compatibility with other devices. For example, in a liquid crystal display (LCD) device, an input signal applied to LCD controller ICs is around 3 volts while 20 to 40 volt signals are required to turn on the thin film transistors (TFTs) used in the LCD panel. In this case, a voltage level shifter is applied for the voltage conversion purpose.

Figure 2A:
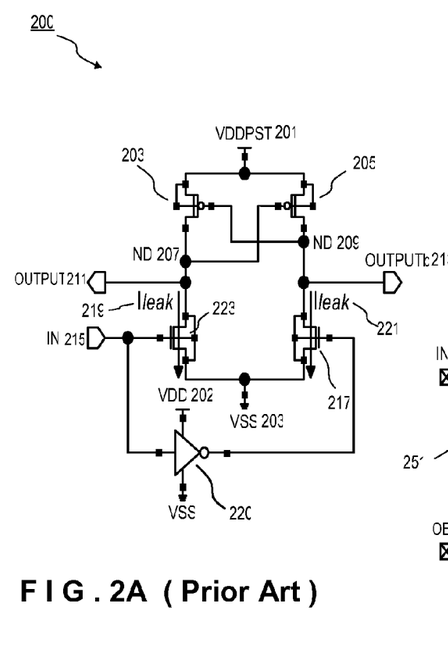
FIGS. 2A-2B illustrate a typical conventional voltage level shifter and a CMOS buffer circuit where the voltage level shifter is applied for interfacing a low voltage circuit and a high voltage circuit in the LCD controller chip.

FIG. 2A illustrates a conventional voltage level shifter 200. The voltage level shifter 200 uses four types of transistors. Low voltage NMOS and PMOS transistors (not shown) are used in the low supply voltage VDD 202 of the inverter 220. High voltage NMOS transistors 217, 223 and high voltage PMOS transistors 203, 205 are used in the high supply voltage VDDPST 201 section. The low voltage transistors have a thinner gate oxide than that of the high voltage transistors. In addition, the high voltage transistors have a threshold voltage higher than that of the low voltage transistors by typically 0.2-0.4 volts to reduce leakage current during the operation of the voltage level shifter 200.

In the conventional voltage level shifter 200, one common drawback is its poor leakage current characteristic. Leakage currents 219, 221 flow from the high supply voltage VDDPST 201 to ground VSS 203, particularly while the core voltage VDD is turned off during a power saving mode, thereby degrading the power consumption performance of the circuit 200. When the core supply voltage VDD 202 is turned off, the transistors coupled to the core supply voltage VDD are left in a floating state, thereby becoming unstable enough to trigger a leakage path from the node ND207 or ND 209 to ground VSS 203 through the transistors 217 and/or 223. Increased leakage current is also observed when the core supply voltage VDD 202 is ramping up.

Referring to FIG. 2A, the conventional voltage level shifter 200 uses an inverter 220 and a differential pair made up of transistors 203, 205, 217, and 223. If a low supply voltage or core supply voltage VDD 202 swings between about 0 volt and 1.2 volts and a high voltage supply or IO supply voltage VDDPST 201 swings between 0 volt and 3.3 volts, the function of the voltage level shifter 200 is to convert a low voltage input signal IN 215 swinging between 0 volt and 1.2 volts (VDD) to a high voltage output signal OUTPUT 211 swinging between 0 volt and 3.3 volts (VDDPST) at an output node disposed between transistor 203 and transistor 223.

When the input signal IN 215 is logic low (VSS), NMOS transistors 217 and PMOS transistor 203 are turned on, causing the output signal OUTPUT 211 to become logic high (VDDPST 201). If the input signal IN 215 is logic high (VDD), NMOS transistors 223 and PMOS transistor 205 are turned on, causing the output signal OUTPUT 211 to be pulled down to logic low (VSS).

Figure 1A:
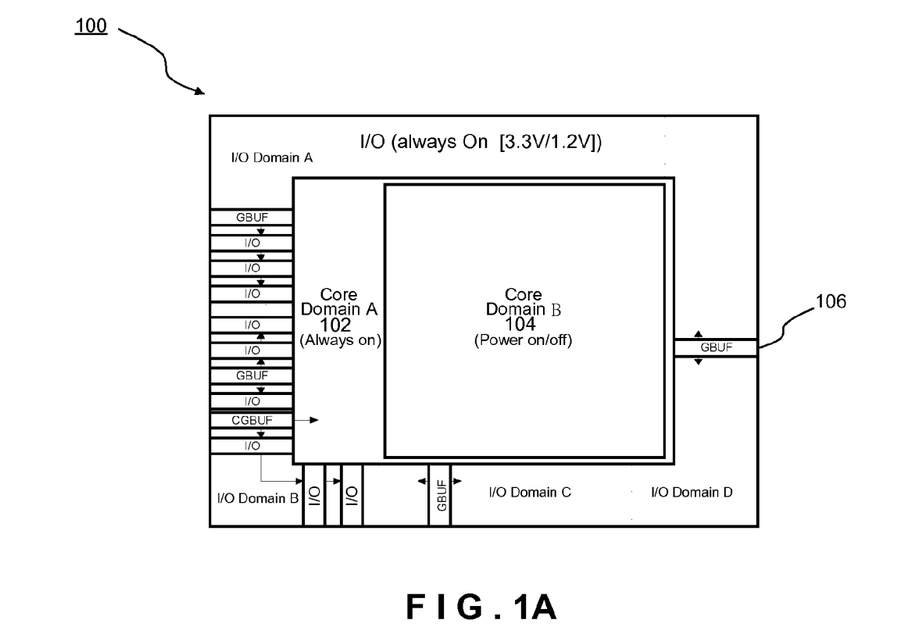
FIG. 1A illustrates a simplified block diagram of a LCD controller chip, to which a voltage level shifter is applied.
Figure 2B:
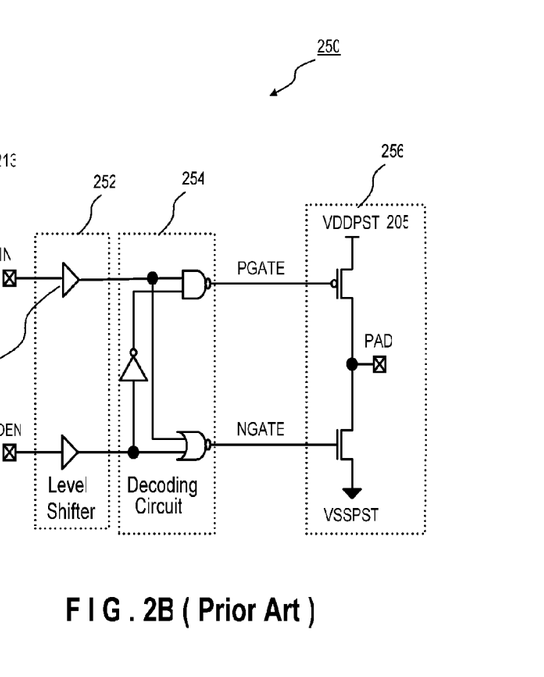

FIG. 2B illustrates a simplified schematic of a CMOS buffer circuit 250 where the voltage level shifter 251 is applied for interfacing a low voltage (core voltage VDD) circuit and a high voltage (IO supply voltage VDDPST) circuit in the LCD controller IC as shown in FIG. 1A. The CMOS buffer circuit 250 comprises a voltage level shifter block 252, a decoding circuit block 254, and a driver circuit 256, respectively. Since the conventional voltage level shifter 200 and the CMOS buffer circuit 250 are well known to those in the art, a detailed description of their operation is omitted.

As briefly described above, one drawback of the conventional voltage level shifter circuit 200 is its poor leakage current performance, particularly when the core supply voltage VDD is turned off during a power saving mode, thereby degrading the power consumption characteristic of the circuit. The present invention recognizes the drawback of the conventional art and provides an improved voltage level shifter.

SUMMARY OF THE INVENTION

In view of the foregoing, embodiments of the present invention provide voltage level shifters having reduced leakage currents during the core power off period, thereby improving the power consumption characteristic of ICs. According to a first embodiment of the present invention, a voltage level shifter includes a first switch module having a first transistor and a second transistor, each transistor having a drain, a gate, and a source, wherein the drains of the first and the second transistors are coupled to a first voltage terminal.

The voltage level shifter further includes a second switch module coupled between the source of the first transistor and a second voltage terminal, the second switch module including at least four transistors coupled each other, wherein an output node is disposed between the first switch module and the second switch module. In addition, the voltage level shifter includes a third switch module coupled between the source of the second transistor and the second voltage terminal, the third switch module including another four transistors coupled each other, wherein each transistor of the second and third switch modules having a gate for receiving a GATE signal, a GATEb signal, a CORE_INPUT signal, a CORE_INPUTb signal, an IO_INPUT signal, or an IO_INPUTb signal, respectively, wherein the first, second and third switch modules are designed to produce an output signal at the output node in response to the IO_INPUTb signal and the IO_INPUT signal, respectively, irrespective of the CORE_INPUTb signal and the CORE INPUT signal when the GATE signal is logic low, thereby reducing a leakage current flowing from the first voltage terminal to the second voltage terminal.

According to a second embodiment of the present invention, a voltage level shifter includes a first switch module having a first transistor and a second transistor, each transistor having a drain, a gate, and a source, wherein the drains of the first and the second transistors are coupled to a first voltage terminal.

The voltage level shifter further includes a second switch module coupled between the first switch module and a second voltage terminal, the second switch module including at least six transistors coupled each other, wherein each transistor of the second switch module having a gate for receiving a GATE signal, a GATEb signal, a CORE_INPUT signal, a CORE_INPUTb signal, an IO_INPUT signal, or an IO_INPUTb signal, respectively, wherein the second switch module is designed to produce an output signal at an output node in response to the IO_INPUTb signal and the IO_INPUT signal respectively, irrespective of the CORE_INPUTb signal and the CORE_INPUT signal when the GATE signal is logic low, thereby reducing a leakage current flowing from the first voltage terminal to the second voltage terminal.

The features and advantages described in the specification are not all inclusive, and particularly, many additional features and advantages will be apparent to one of ordinary skill in the art in view of the drawings, specification, and claims hereof. Moreover, it should be noted that the language used in the specification has been principally selected for readability and instructional purposes, and may not have been selected to delineate or circumscribe the inventive subject matter.

The construction and method of operation of the invention, however, together with additional objects and advantages thereof will be best understood from the following description of specific embodiments when read in connection with the accompanying drawings.

BRIEF DESCRIPTION OF THE DRAWINGS

A more complete understanding of the present invention may be described by referring to the detailed description and claims when considered in conjunction with the following figures.

DETAILED DESCRIPTION OF THE INVENTION

The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

FIG. 1A illustrates a block diagram of the LCD controller IC 100 which comprises a plurality of IO domains A~D and core domains A and B. Referring to FIG. 1A, while a core voltage 112 for the core domain A 102 is normally on, another core voltage 114 for the core domain B 104 is designed to be turned off for a predetermined period of time during a power saving mode (core power off mode) as illustrated in FIG. 1B.

Figure 1B:
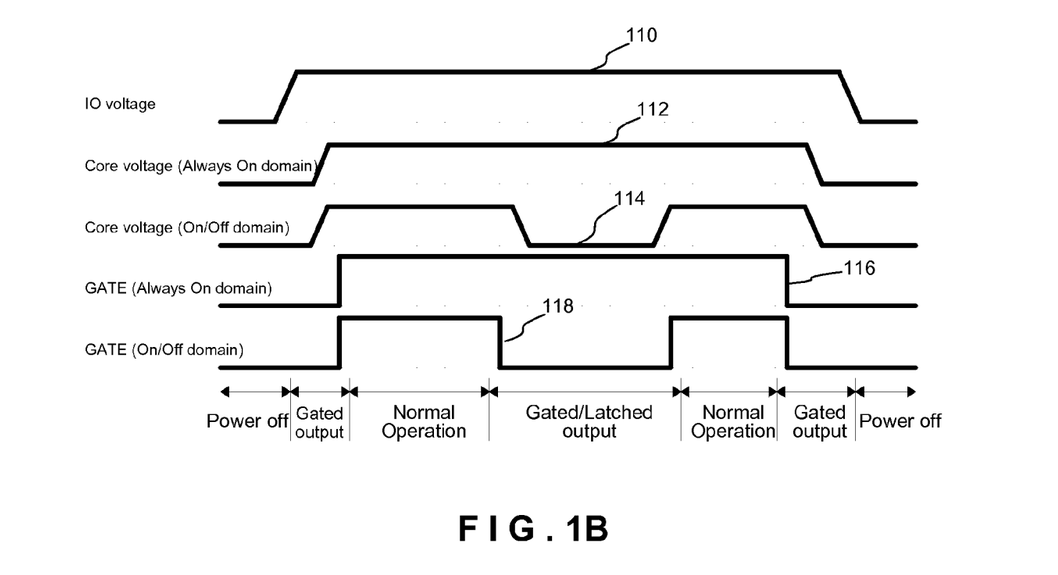
FIG. 1B illustrates a simplified voltage-timing diagram for various signals used in the LCD controller chip.

FIG. 1B illustrates a simplified voltage-timing diagram of various supply voltages and control signals used in the LCD controller IC 100. Among these signals 110, 112, 114, 116, 118, GATE signal 116 and IO voltage signal 110 for the IO domains A~D are normally on, while the GATE signal 118 and the core voltage signal 114 for the core domain B 104 are off during a power saving mode. GATE signals 116/118 are generated by the input buffers GBUFF 106 shown in FIG. 1A.

Figure 3A:
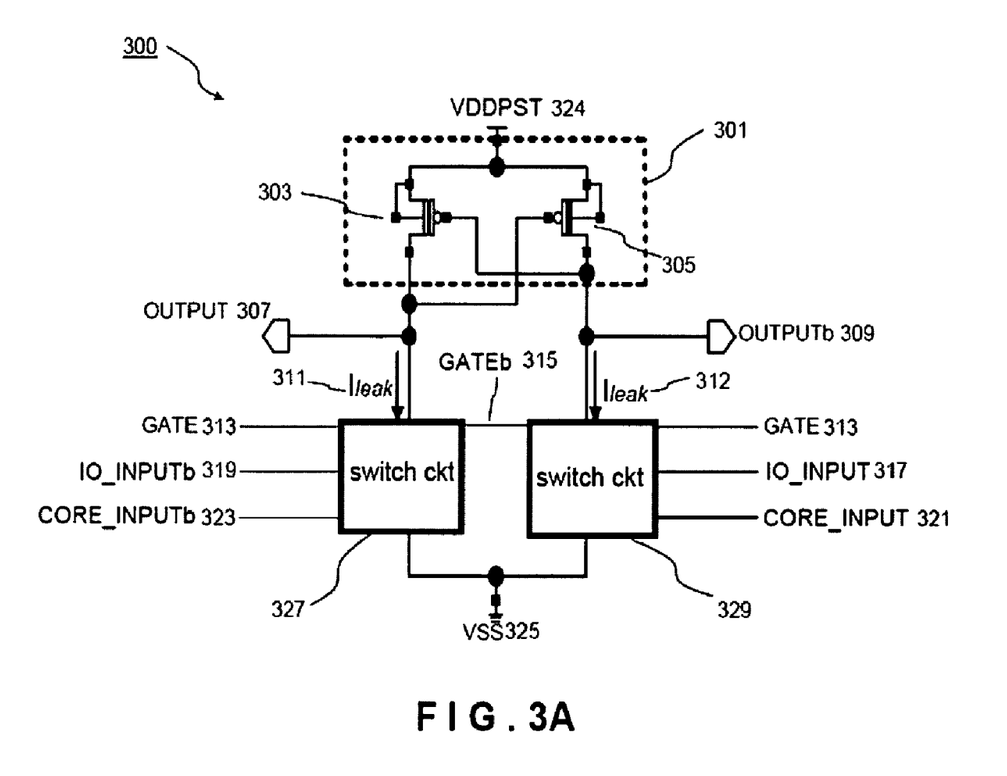
FIGS. 3A-3B illustrate a simplified block diagram of a voltage level shifter in accordance with one embodiment of the present invention and a table showing logic level of various signals used in the voltage level shifter.
Figure 4:
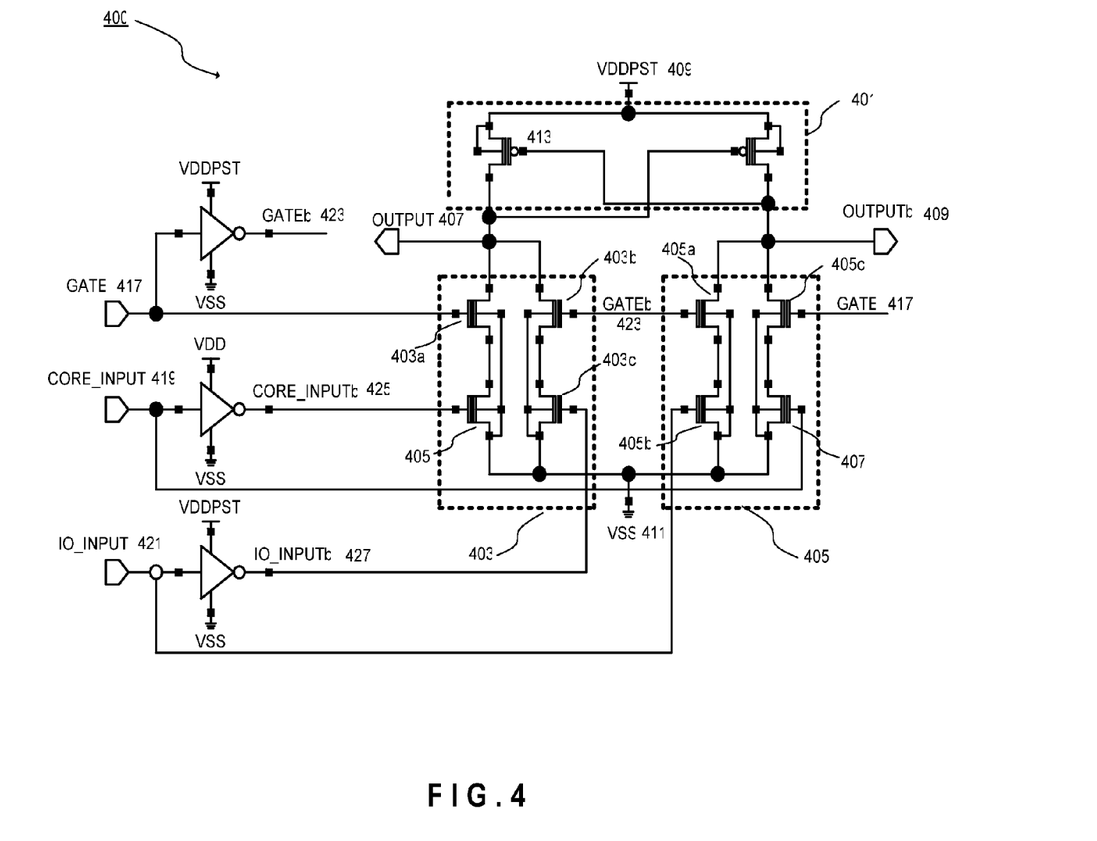
FIG. 4 illustrates a voltage level shifter circuit in accordance with one embodiment of the present invention.
Figure 5:
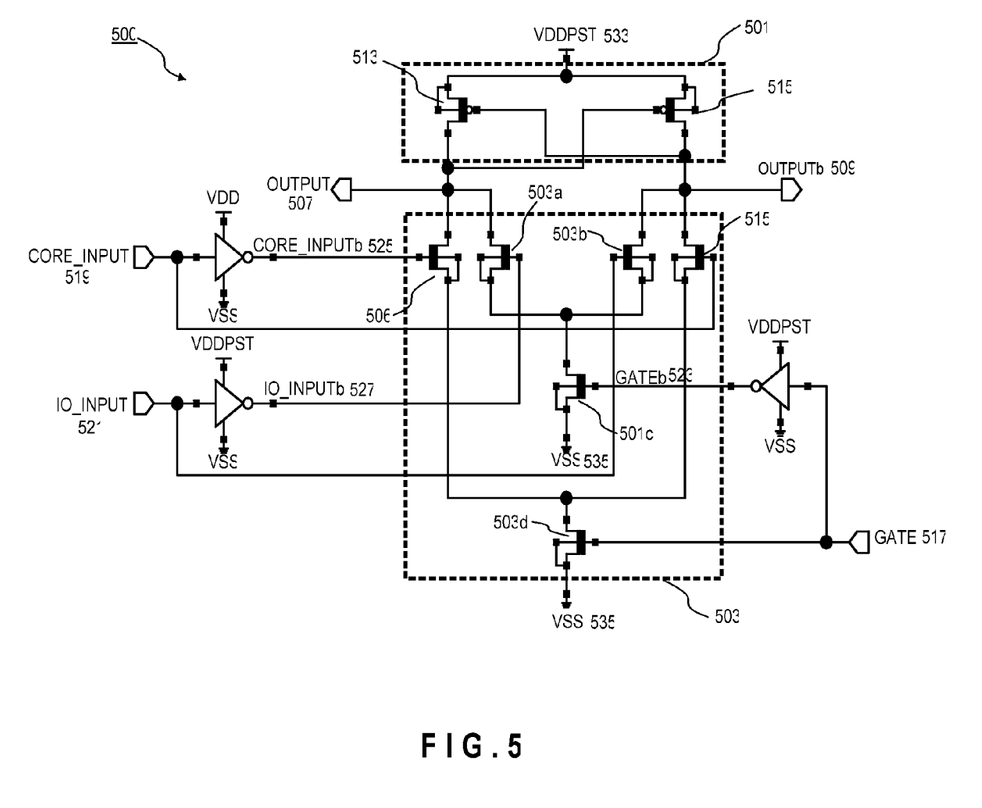
FIG. 5 illustrates a simplified voltage level shifter circuit in accordance with another embodiment of the present invention.

An improved voltage level shifter illustrated in FIGS. 3A, 4, and 5 can be applied in the LCD controller IC shown in FIG. 1A. FIG. 3A illustrates a simplified block diagram of a voltage level shifter 300 in accordance with one exemplary embodiment of the present invention. The voltage level shifter 300 is designed to prevent leakage current during a power saving mode when a core supply voltage VDD (not shown) is off. Referring to FIG. 3A, a voltage level shifter 300 includes a first switch module 301 comprising a first transistor 303 and a second transistor 305, both are PMOS transistors and each of them has a drain, a gate, and a source. The sources of the first transistor 303 and the second transistor 305 are coupled to an IO supply voltage VDDPST 324 that is swinging from 0 volt to 3.3 volts.

The voltage level shifter 300 further includes a second switch module 327 coupled between the drain of the first transistor 303 and ground VSS 325. The second switch module 327 further includes four transistors coupled to one another as further shown in FIG. 4. An output node 307 is connected to a node located between the first switch module 301 and the second switch module 327. In addition, the voltage level shifter 300 also includes a third switch module 329 coupled between the drain of the second transistor 305 and the ground VSS 325. The third switch module 329 further includes another four transistors coupled to one another as shown in FIG. 4. Each transistor of the second and third switch modules has its own gate terminal for receiving a GATE signal 313, a GATEb signal 315, an IO_INPUT signal 317, an $IO_{13}$ INPUTb signal 319, a CORE_INPUT signal 321, and a $CORE_{13}$ INPUTb signal 323, respectively. The first, second, and third switch modules 301, 327, and 329 are designed to generate an output signal at the output nodes 307 and 309 in response to the various control signals described above.

Figure 3B:
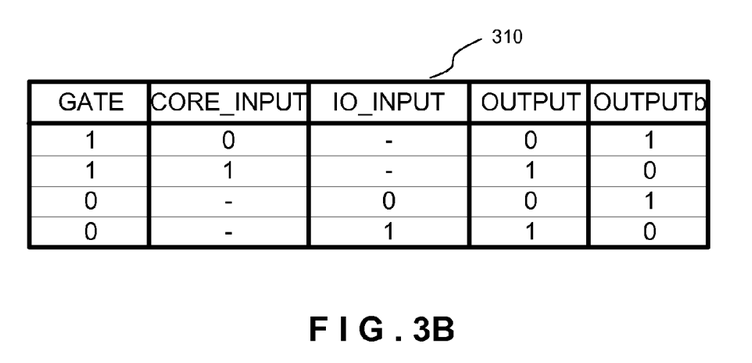

FIG. 3B illustrates a table showing logic levels of the various signals used in the voltage level shifter 300. Referring to FIG. 3B, if the GATE signal is at logic high ("1") state, the logic state of the output signal OUTPUT is determined by that of the CORE _INPUT signal 321. And if the GATE signal is at a logic low ("0") state, then the logic state of the output signal OUTPUT is determined by that of the IO_INPUT signal. Referring to FIG. 1B, the GATE signal and core supply voltage VDD maintain a logic high state during a normal operation. As further shown in FIG. 1B, when the core supply voltage VDD is turned off (logic low), the GATE signal is at a logic low state and the output signal OUTPUT is only determined by the logic state of the IO_INPUT signal, irrespective of the logic state of the CORE_INPUT signal as described above. Consequently, the operation of the voltage level shifter 300 is not affected by the logic state of the core supply voltage VDD, thereby preventing leakage currents 311 and 312 that may flow when VDD is off. A further detailed explanation is given below with reference to FIG. 4. As well known to those in the art and as further shown in FIG. 2A, the complementary output signal OUTPUTb represents a reverse state of the output signal OUTPUT.

FIG. 4 illustrates a voltage level shifter circuit 400 in accordance with one embodiment of the present invention. The voltage level shifter 400 comprises a first switch module 401, a second switch module 403, and a third switch module 405, each coupled to one another as shown in FIG. 4. Description will be made with focus on the second switch module 403 and the third switch module 405 for the benefit of brevity.

The second switch module 403 is coupled between the source of the first transistor 413 and ground VSS terminal 411. The second switch module 403 further includes four transistors coupled to one another as shown in FIG. 4. Specifically, the second switch module 403 comprises a first NMOS transistor 403a with gate coupled to the GATE signal 417 and with drain coupled to the OUTPUT 407. The second switch module 403 further includes a second NMOS transistor 405 with gate coupled to the CORE_INPUTb signal 425 and with source coupled to the ground VSS 411, wherein the first and second NMOS transistors 403a and 405 of the second switch module are coupled to one another in series.

In addition, the second switch module 403 includes a third NMOS transistor 403b with gate coupled to the GATEb signal 423 and with drain coupled to the output 407 and a fourth NMOS transistor 403c with gate coupled to the IO_INPUTb signal 427 and with source coupled to the ground VSS 411, wherein the third and fourth NMOS transistors 403b and 403c are coupled to one another in series.

Likewise, the third switch module 405 comprises a first NMOS transistor 405a with gate coupled to the GATEb signal 423 and with drain coupled to an OUTPUTb 409. The third switch module 405 further includes a second NMOS transistor 405b with gate coupled to the IO_INPUT signal 421 and with source coupled to the ground VSS 411, wherein the first and second NMOS transistors 405a and 405b of the third switch module 405 are coupled to one another in series.

In addition, the third switch module 405 further includes a third NMOS transistor 405c with gate coupled to the GATE signal 417 and with drain coupled to the OUTPUTb 409 and a fourth NMOS transistor 407 with gate coupled to the CORE_INPUT signal 419 and with source coupled to the ground VSS 411, wherein the third and fourth NMOS transistors 405c and 407 of the third switch module 405 are coupled to one another in series.

Referring back to FIGS. 3B and 4, when the GATE signal 417 is logic high, an output signal at OUTPUT 407 is controlled only by the CORE_INPUTb signal 425 or CORE_INPUT signal 407. This is because when the GATE signal 417 is logic high, transistor 403b of the second switch module 403 and transistor 405a of the third switch module 405 are turned off, and the voltage level at the OUTPUT 407 or OUTPUTb 409 is purely determined by the transistor 405 and 407 whose gates are controlled by the CORE_INPUT signal 419 or its complementary signal CORE_INPUTb 425.

If the GATE signal 417 is logic low, the core supply voltage VDD at core domain B 104 will be turned off, rendering all the transistors in the core domain B in a floating state. When the GATE signal 417 is logic low, an output signal at OUTPUT 407 is controlled only by the IO_INPUT signal 421 or its complementary signal IO_INPUTb signal 427. This is because when the GATE signal 417 is logic low, NMOS transistor 403a and 405c of the second and third switch modules 403, 405 are turned off, and the voltage level of the OUTPUT 407 or OUTPUTb 409 will be only determined by the transistor 403c and 405b whose gates are controlled by the IO_INPUTb signal 427 and its complementary signal IO_INPUT 421, respectively. This means that when the core supply voltage VDD is turned off during a power saving mode, the operation of the voltage level shifter 400 is controlled only by the IO_INPUT signal 421 and its complementary signal IO_INPUTb 427, which are independent of the core supply voltage VDD level. Consequently, leakage currents caused by the core power off mode (VDD is off) is prevented.

FIG. 5 illustrates a simplified voltage level shifter 500 in accordance with another embodiment of the present invention. The voltage level shifter 500 includes a first switch module 501 having a first transistor 513 and a second transistor 515, each transistor having a drain, a gate, and a source, wherein the drains of the first transistor 513 and the second transistor 515 are coupled to an IO supply voltage VDDPST 533. The voltage level shifter 500 further includes a second switch module 503 coupled between the first switch module 501 and ground VSS 535. The second switch module 503 includes six transistors coupled to one another and each transistor of the second switch module 503 has a gate for receiving a GATE signal 517, a GATEb signal 523, a CORE_INPUT signal 519, a CORE_INPUTb signal 525, an IO_INPUT signal 521, or an IO_INPUTb signal 527, respectively.

The second switch module 503 is designed to generate an output signal at OUTPUT 507 in response to the IO_INPUTb signal 527 and the IO_INPUT signal 521, irrespective of the CORE_INPUT signal 519 or the CORE_INPUTb signal 525 when the GATE signal 517 is logic low, thereby preventing a leakage current flowing from the IO supply voltage VDDPST 533 to the ground VSS 535, in a similar way as explained above. The operation of the voltage level shifter 500 is similar to that of the voltage level shifter 400 and thus a detailed explanation is omitted for the benefit of brevity.

Figure 6:
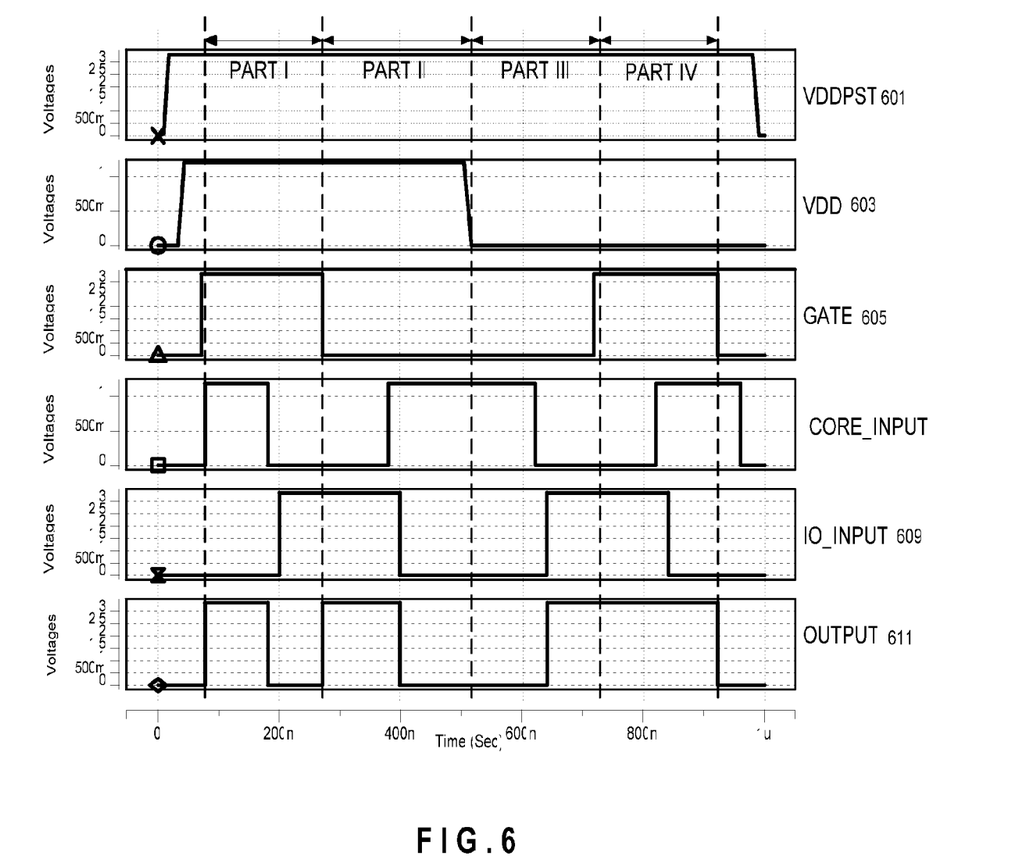
FIG. 6 illustrates a simplified voltage-timing diagram for various supply voltages and signals used in the voltage level shifter shown in FIGS. 5 and 6.

FIG. 6 illustrates a simplified voltage-timing diagram for various supply voltages and control signals used in the voltage level shifter shown in FIGS. 4 and 5. As shown in FIG. 6, the core supply voltage VDD 603 and the CORE_INPUT signal 607 swing between 0 volt and 1.2 volts, while the IO supply voltage VDDPST 601, the IO_INPUT signal 609, and the OUTPUT 611 swing between 0 volt and 3.3 volts.

Referring to FIG. 6, in part I, VDD=1 (high), GATE=1 (high), and the logic state of the output signal OUTPUT (high) is determined by that of the CORE_INPUT signal 607. In part II, VDD=1 (high), GATE=0 (low), and the logic state of the output signal OUTPUT (high) is determined by that of the IO_INPUT signal 609. In part III, VDD=0 (low), GATE=0 (low), and the logic state of the output signal OUTPUT (low) is determined by that of the IO_INPUT signal 609. In part IV, when VDD=0 (low), GATE=1 (high), the logic state of the output signal OUTPUT is rendered in tri-state, meaning that the output terminal will be in a high impedance state. As shown in FIGS. 1B and 3B, when GATE signal is logic high, VDD is normally high and thus part IV condition is generally not allowed in the operation of the voltage level shifter.

The above illustration may provide many different embodiments for implementing different features of the present invention. Specific embodiments of components and processes are described to help clarify the invention. These are, of course, merely embodiments and are not intended to limit the invention.

What is claimed is:

1. A voltage level shifter with a reduced leakage current, comprising:
    a first switch module having a first transistor and a second transistor, each transistor having a drain, a gate, and a source, wherein the sources of the first and the second transistors are coupled to a first voltage terminal;
    a second switch module coupled between the drain of the first transistor and a second voltage terminal, the second switch module including at least four transistors whose gates are coupled to a low voltage input signal (a CORE_INPUT or CORE_INPUTb signal) and high voltage input signals (a GATE signal, a GATEb signal, an IO_INPUT signal and an IO_INPUTb signal), respectively, the low voltage input signal and the high voltage signals having a first voltage swing and a second voltage swing, respectively,
wherein each of the GATEb, CORE_INPUTb, and IO_INPUTb signals is a complement of the GATE, CORE_INPUT, and IO_INPUT signals, respectively, and an output node is coupled to drains of two of the at least four transistors; and
a third switch module coupled between the drain of the second transistor and the second voltage terminal, the third switch module including another four transistors whose gates are coupled to the low voltage input signal and the high voltage input signals, respectively,
wherein the first, second, and third switch modules are designed to produce an output signal at the output node in response to only the high voltage input signals including IO_INPUT and the IO_INPUTb signals when the GATE signal is logic low, thereby reducing a leakage current.

2. The voltage level shifter of claim 1, wherein the first voltage terminal has a voltage with a peak of 3.3 volts while the second voltage terminal is connected to an electrical ground.

3. The voltage level shifter of claim 1, wherein the first voltage swing has a peak of 1.2 volts.

4. The voltage level shifter of claim 1, wherein the second voltage swing has a peak of 3.3 volts.

5. The voltage level shifter of claim 1, the second switch module comprising:
a first NMOS transistor with its gate coupled to the GATE signal and with drain coupled to the output node;
a second NMOS transistor with its gate coupled to the CORE_INPUTb signal and with source coupled to the second voltage terminal, wherein the first and second NMOS transistors are coupled to each other in series;
a third NMOS transistor with its gate coupled to the GATEb signal and with drain coupled to the output node; and
a fourth NMOS transistor with its gate coupled to the IO_INPUTb signal and with source coupled to the second voltage terminal, wherein the third and fourth NMOS transistors are coupled to each other in series.

6. The voltage level shifter of claim 5, wherein the output signal swings with a peak of 3.3 volts at the output node in response to the CORE_INPUTb signal, irrespective of the IO_INPUTb signal, upon the GATE signal becoming logic high.

7. The voltage level shifter of claim 5, wherein the output signal swings with a peak of 3.3 volts at the output node in response to the IO_INPUTb signal, irrespective of the CORE_INPUTb signal, upon the GATE signal becoming logic low.

8. The voltage level shifter of claim 1, the third switch module comprising:
a fifth NMOS transistor with its gate coupled to the GATEb signal and with its drain coupled to an inverted output node disposed between the source of the second transistor and the third switch module;
a sixth NMOS transistor with its gate coupled to the IO_INPUT signal and with its source coupled to the second voltage terminal, wherein the fifth and sixth NMOS transistor are coupled to each other in series;
a seventh NMOS transistor with its gate coupled to the GATEb signal and with its drain coupled to the inverted output node; and
an eighth NMOS transistor with its gate coupled to the CORE_INPUT signal and with its source coupled to the second voltage terminal, wherein the seventh and eighth NMOS transistors are coupled to each other in series, and
wherein the first, second, and third switch modules are designed to produce an inverted output signal at the inverted output node.

9. The voltage level shifter of claim 8, wherein the inverted output signal swings with a peak of 3.3 volts in response to the CORE_INPUT signal, irrespective of the IO_INPUT signal, upon the GATE signal becoming logic high.

10. The voltage level shifter of claim 8, wherein the inverted output signal swings with a peak of 3.3 volts in response to the IO_INPUT signal, irrespective of the CORE_INPUT signal, upon the GATE signal becoming logic low.

11. The voltage level shifter of claim 1, wherein the GATE signal is generated by an input buffer in a LCD controller.

12. A voltage level shifter with a reduced leakage current, comprising:
a first switch module having a first transistor and a second transistor, each transistor having a drain, a gate, and a source, wherein the sources of the first and the second transistors are coupled to a first voltage terminal; and
a second switch module coupled between the first switch module and a second voltage terminal, the second switch module including at least six transistors whose gates are coupled to low voltage input signals (a CORE_INPUT and CORE_INPUTb signal) and high voltage input signals (a GATE signal, a GATEb signal, an IO_INPUT signal, and an IO_INPUTb signal), respectively, the low voltage input signals and the high voltage input signals having a first voltage swing and a second voltage swing, respectively,
wherein each of the GATEb, CORE_INPUTb, and IO_INPUTb signals is a complement of the GATE, CORE_INPUT, and IO_INPUT signals, respectively, and an output node is coupled to drains of two of the at least six transistors, and
wherein the first and second switch modules are designed to produce an output signal at the output node in response to only the high voltage input signals including the IO_INPUT and the IO_INPUTb signals when the GATE signal is logic low, thereby reducing a leakage current.

13. The voltage level shifter of claim 12, wherein the first voltage terminal has a voltage with a peak of 3.3 volts while the second voltage terminal is connected to an electrical ground.

14. The voltage level shifter of claim 12, wherein the first voltage swing has a peak of 1.2 volts.

15. The voltage level shifter of claim 12, wherein the second voltage swing has a peak of 3.3 volts.

16. The voltage level shifter of claim 12, the second switch module comprising:
a first NMOS transistor with its gate coupled to the CORE_INPUTb signal and with its drain coupled to the output node;
a second NMOS transistor with its gate coupled to the IO_INPUTb signal and with its drain coupled to the output node, wherein sources of the first and second NMOS transistors are coupled to the second voltage terminal via a third NMOS transistor and a fourth NMOS transistor, respectively;
the third NMOS transistor with its gate coupled to the GATE signal and with its drain coupled to the first NMOS transistor in series;
the fourth NMOS transistor with its gate coupled to the GATEb signal and with its drain coupled to the first NMOS transistor in series, wherein sources of the third and fourth NMOS transistors are coupled to the second voltage terminal;

a fifth NMOS transistor with its gate coupled to the IO_INPUT signal and with its drain coupled to an inverted output node disposed between the source of the second transistor and the second switch module; and a sixth NMOS transistor with its gate coupled to the IO_INPUT signal and with its drain coupled to the inverted output node, and wherein sources of the fifth and sixth NMOS transistors are coupled to the second voltage terminal via the third NMOS and the fourth NMOS transistors, respectively.

17. The voltage level shifter of claim 16, wherein the output signal swings with a peak of 3.3 volts at the output node in response to the CORE_INPUT and CORE_INPUTb signals, irrespective of the IO_INPUT and IO_INPUTb signals, upon the GATE signal becoming logic high.

18. The voltage level shifter of claim 16, wherein the output signal swings with a peak of 3.3 volts at the output node in response to the IO_INPUT and IO_INPUTb signals, irrespective of the CORE_INPUT and CORE_INPUTb signals, upon the GATE signal becoming logic low.

19. The voltage level shifter of claim 16, wherein the inverted output signal swings with a peak of 3.3 volts in response to the IO_INPUT and IO_INPUTb signals, irrespective of the CORE_INPUT and CORE_INPUTb signals, upon the GATE signal becoming logic low.

20. The voltage level shifter of claim 12, wherein the GATE signal is generated by an input buffer in a LCD controller.

* * * * *